(12) United States Patent
Quinn

(10) Patent No.: US 7,282,954 B2
(45) Date of Patent: Oct. 16, 2007

(54) CAPACITOR-COUPLED LEVEL SHIFTER WITH DUTY-CYCLE INDEPENDENCE

(75) Inventor: Patrick Allen Quinn, Aloha, OR (US)

(73) Assignee: Avnera Corporation, Beaverton, OR (US)

( * ) Notice: Subject to any disclaimer, the term of this patent is extended or adjusted under 35 U.S.C. 154(b) by 69 days.

(21) Appl. No.: 11/341,337

(22) Filed: Jan. 26, 2006

(65) Prior Publication Data

US 2007/0182447 A1   Aug. 9, 2007

(51) Int. Cl.
   *H03K 19/0175*   (2006.01)
(52) U.S. Cl. .............................. 326/81; 326/68; 326/80
(58) Field of Classification Search .................. 326/68, 326/81; 327/333
   See application file for complete search history.

(56) References Cited

U.S. PATENT DOCUMENTS 6,980,194 B2 * 12/2005 Tobita ........................ 345/100
2004/0124901 A1 * 7/2004 Yamahira et al. ........... 327/333

* cited by examiner

*Primary Examiner*—Anh Q. Tran
(74) *Attorney, Agent, or Firm*—Werner & Axenfeld, PC

(57) ABSTRACT

A circuit architecture, or topology, that provides a level shifter which is substantially independent of the duty cycle of an input signal includes an H-bridge arrangement of field effect transistors, a pair of capacitively coupled inputs terminals connected to the gates of the high-side (i.e., connected to the positive power supply) transistors and a pair of voltage dividers to set the bias voltage at the gates of the high-side transistors, wherein one side of each voltage divider is coupled to the power supply node and the other side of each voltage divider is cross-coupled to the output node of the opposite side of the H-bridge.

20 Claims, 3 Drawing Sheets

CAPACITOR-COUPLED LEVEL SHIFTER WITH DUTY-CYCLE INDEPENDENCE

FIELD OF THE INVENTION

The present invention relates generally to circuit architectures, or topologies, that provide level-shifters having performance that is substantially independent of the duty cycle of input signals which are capacitively coupled to the level-shifter.

BACKGROUND

Advances in semiconductor manufacturing technology have resulted in ever decreasing physical dimensions for the various circuit elements, such as, for example, field effect transistors, which are used in forming integrated circuits. In turn, the smaller dimensions of such circuit elements have allowed the integration onto a single chip of many more transistors than was possible in the past.

As is well-known in the field of integrated circuits, reducing the dimensions of circuit elements generally, and of the field effect transistor (FET) in particular, requires a corresponding reduction in the power supply voltage in order to avoid electric field strengths within the integrated circuit which might result in dielectric breakdown, or other adverse effects. Additionally, transistors of such small dimensions tend to have significant leakage current, or sub-threshold conduction, Therefore to maintain the power consumption of integrated circuit having a large number of small, i.e., "leaky" transistors at a reasonable level, it has become common to reduce the power supply voltage.

Even in circumstances where leakage and dielectric breakdown are not issues, those skilled in the art of integrated circuit design recognize that lowering the supply voltage to a circuit is a significant factor in reducing power consumption.

In response to various motivations, such as those mentioned above, there has been an on-going trend to reduce power supply voltages. One consequence of this trend is that many systems or applications have various circuits with different voltage supply requirements. For example, a system may have some components that operate at 5 volts, and others that operate at 3.3 volts. Similarly, a single integrated circuit may have portions therein which operate at different voltages, for example, 3.3 volts and 1.8 volts. It will be appreciated that a signal that is generated in one voltage supply domain, may need to be level-shifted in order to properly interact with circuit which operate in a different power supply domain.

Various level-shifting circuits have been developed in order to provide the level shifting functionality mentioned above. Unfortunately, one drawback of conventional level-shifters of the H-bridge configuration with capacitively coupled input signals, is that the performance of such level-shifters is dependent upon the duty cycle of the input signals.

What is needed are methods and apparatus for providing level shifters with capacitively coupled inputs that have performance characteristics which are substantially independent of the duty cycle of the input signals.

SUMMARY OF THE INVENTION

Briefly, a circuit architecture, or topology, that provides a level shifter which is substantially independent of the duty cycle of an input signal includes an H-bridge arrangement of field effect transistors, a pair of capacitively coupled inputs terminals connected to the gates of the high-side (i.e., connected to the positive power supply) transistors and a pair of voltage dividers to set the bias voltage at the gates of the high-side transistors, wherein one side of each voltage divider is coupled to the power supply node and the other side of each voltage divider is cross-coupled to the output node of the opposite side of the H-bridge.

In a further aspect of the present invention, the high-side transistors are chosen to be small in size, resulting in very small $C_{ISS}$, which in turn permits the capacitance of the couple capacitors to be much larger than the $C_{ISS}$ values, to provide for high levels of coupling, and yet the physical size of the capacitors is small enough to make integration onto the same integrated circuit with the H-bridge transistors practical.

DETAILED DESCRIPTION

Figure 1:
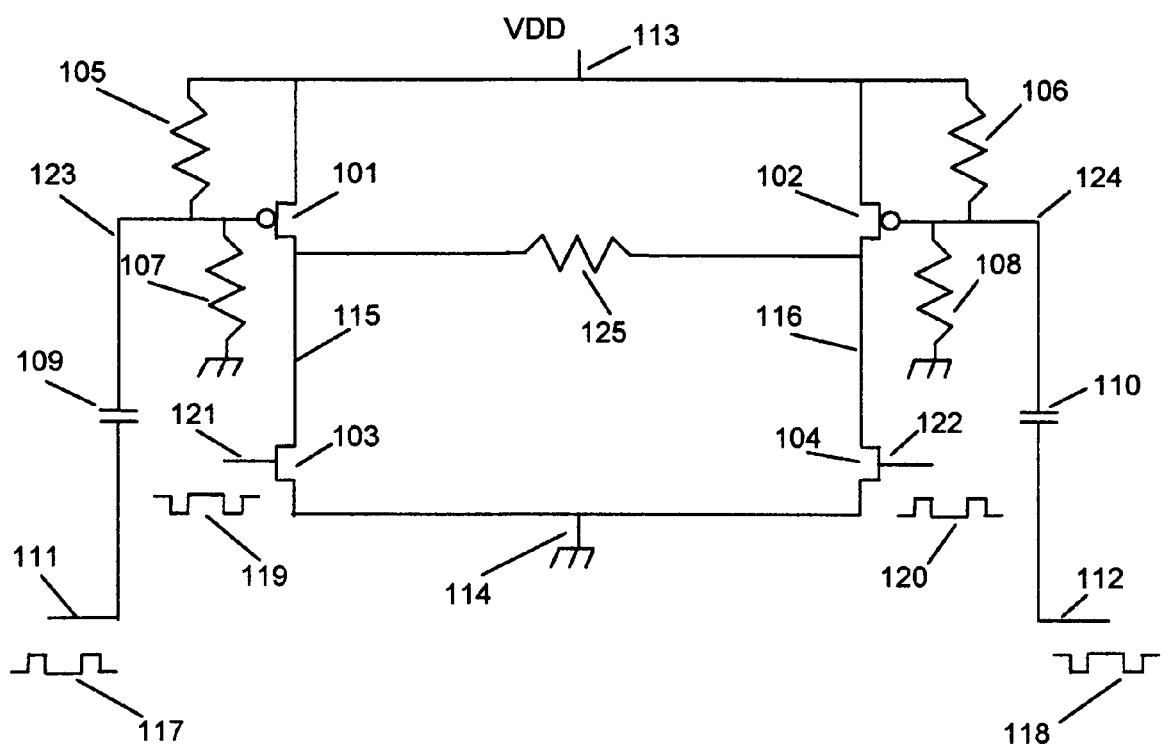
FIG. 1 is a schematic diagram of a conventional H-bridge circuit.

Generally, the present invention relates to circuits and methods to capacitively level-shift a low-voltage digital signal to a high-voltage PFET gate drive, such as the high-side of an H-bridge, in such a way that the DC value of the gate drive is essentially independent of the duty cycle of the digital input signal. Various embodiments of the present invention may be configured to shift the voltage levels of logic signals form one power supply value to another.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The terms integrated circuit (IC), semiconductor device, monolithic device, microelectronic device, and chip are often used interchangeably in the field of electronics generally. The present invention is applicable to all the above as they are generally understood in the field.

Substrate, as used herein, refers to the physical object which is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

FET, as used herein, refers to metal-oxide-semiconductor field effect transistors (MOSFETs). These transistors are also known as insulated gate field effect transistors (IGFETs). As used herein, NFET refers to an n-channel FET, and PFET refers to a p=channel FET.

The term "gate" is context sensitive and can be used in two ways when describing integrated circuits. As used herein, gate refers to the insulated gate terminal of a three terminal FET when used in the context of transistor circuit configuration, and refers to a circuit for realizing an arbitrary logical function when used in the context of a logic gate. It is noted that a FET can be viewed as a four terminal device when the semiconductor body is considered.

Source/drain (S/D) terminals refer to the terminals of a FET, between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminals when the FET is operated in a circuit. Generally, for an NFET the two S/D terminals are designated to be the drain and source for being coupled, respectively, to a more positive and a less positive voltage supply, while for a PFET the two S/D terminals are designated to be the source and drain for being coupled, respectively, to a more positive and a less positive voltage supply.

P-driver is an alternative expression used in the semiconductor industry to refer to a pull-up PFET.

Terminal refers to a connection point. Typically, outputs, or output terminals, are coupled to inputs, or input terminals, to propagate signals.

Back bias refers generally to the voltage from a p+ or n+ junction to its respective substrate. As used in the circuit examples herein, back bias is measured as the voltage, with respect to ground, of a p+ junction to the voltage, with respect to ground, of the n type substrate (typically a well) in which the p+ junction resides. Other terms having substantially the same meaning are substrate bias, substrate voltage, well bias, well voltage, reverse bias and reverse voltage.

An H-bridge, sometimes referred to as a "full bridge", is a drive structure used in class D amplifiers, motor drivers, switching power supplies, and other circuits. Generally, there are four switching elements within the bridge. These four elements, or switches, are turned on in pairs, either high left and lower right, or lower left and high right, but never both switches on the same "side" of the bridge. If both switches on one side of a bridge are turned on a short circuit, or at least a relatively low resistance path, is created between the power supply and ground nodes.

Referring to FIG. 1, a schematic representation of a conventional H-bridge is shown. A first resistor 105 is coupled between a power supply node 113 (Vdd) and node 123; and a second resistor 107 is coupled between node 123 and a ground node. A first capacitor 109 is coupled between node 123 and a first input node 111. A first PFET 101 is coupled source-to-drain between Vdd 113 and a node 115. The gate of PFET 101 is coupled to node 123. A first NFET 103 is coupled drain-to-source between node 115 and ground. A third resistor 106 is coupled between Vdd 113 and node 124; and a fourth resistor 108 is coupled between node 124 and ground. A second capacitor 110 is coupled between node 124 and a second input node 112. A second PFET 102 is coupled source-to-drain between Vdd 113 and a node 116. The gate of PFET 102 is coupled to node 124. A second NFET 104 is coupled drain-to-source between node 116 and ground. A fifth resistor 125 is coupled between nodes 115 and 116. It will be appreciated that resistor 125 represents a load impedance for the H-bridge. For example, if the H-bridge of FIG. 1 was used as a motor driver, then an electric motor would be connected in place of resistor 125.

Still referring to FIG. 1, signal 117 is provided at node 111, and signal 120 is provided at node 122. Signals 117 and 120 are approximately equal in terms of timing and voltage swing. Input signal 118 is provided at node 112, and input signal 119 is provided at node 121 (the gate of NFET 102). Signal 120 is provided at node 122 (the gate of NFET 104). Signals 118 and 119 are also approximately equal in terms of timing and voltage swing. It is noted that signals 119 and 120 are approximately differential with respect to each other; and similarly, signals 117 and 118 are approximately differential with respect to each other. Various combinations of the four drive FETs 101, 102, 103, 104 are used, that is, turned on, to couple the load impedance 125 between the power supply and ground. The polarity of the voltage applied to load impedance 125 depends on the polarities of the input drive signals 117, 118, which are essentially 180 degrees out of phase with each other, are typically repetitive, and have duty cycles that vary. Similarly, signals 119, 120 are also essentially 180 degrees out of phase with each other, are typically repetitive, and have duty cycles that vary. Drive signals 117 and 120 differ slightly, as do signals 119 and 118. The difference is in the timing of the edges, which is done to avoid turning on either FETs 101 and 103, or FETs 102 and 104 at the same time. Such timing relationships have historically been referred to in this field as "non-overlapping timing".

Still referring to FIG. 1, when input signal 117 is low and input signal 120 is high, then FETs 101 and 104 turn on, and consequently pull node 115 to the supply voltage and node 116 is pulled to ground. It is noted that the present invention does not limit the supply voltage (Vdd) to any particular value, and various embodiments may be connected to supply voltages of just a few volts to supply voltages of several hundred volts. When input signal 118 is low and input signal 119 is high then FETs 102 and 103 turn on, and consequently, pull node 115 to ground, and pull node 116 to the supply voltage Vdd. In this way, the H-bridge (FETs 101, 102, 103, 104) replicates the input drive signal across the load 125, but with a larger voltage swing. Typically, the resistance of resistor 105 is nominally equal to the resistance of resistor 106, and the resistance of resistor 107 is nominally equal to the resistance of resistor 108.

Still referring to FIG. 1, consider and illustrative example wherein V1=5 volts (i.e. the voltage swing of the input signals), and Vdd=25 volts. In this case, nodes 123 and 124 would typically be biased to a voltage defined by Vdd−1/2 V1, or 22.5 volts. When the duty cycle of the input signals is 50%, this circuit arrangement works well. However, as the duty cycle of the input signals moves away from 50%, node 123 and 124 seriously de-bias, which typically results in FETs 101 and 102 failing to fully turn on or off. This performance limitation is significant because it limits the useful range of input duty cycle, and may cause over-dissipation in the FETs. Conventional approaches to overcoming this limitation have required complicated drive interface circuitry.

Figure 2:
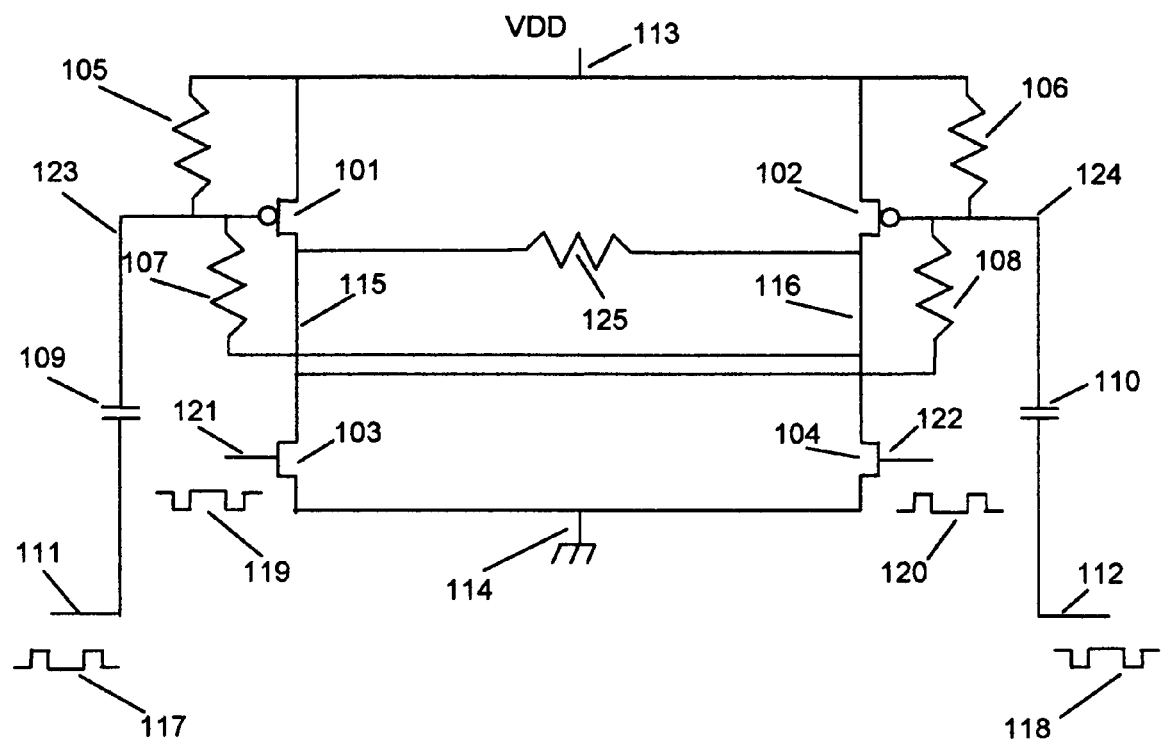
FIG. 2 is a schematic diagram of an H-bridge circuit in accordance with the present invention in which resistor connections of the conventional H-bridge circuit are changed so that rather than being coupled to ground, each of these resistors is coupled to the intermediate node on the opposite side of the H-bridge.

Referring to FIG. 2, a circuit in accordance with the present invention is shown. The elements of the circuit of FIG. 2 are the same as those shown in FIG. 1, however the interconnection of those elements is different. More particularly, resistor 107 is connected between node 123 and node 116, rather than between node 123 and ground as is shown in the conventional arrangement of FIG. 1. Similarly, resistor 108 is coupled between node 124 and node 115, rather than between node 124 and ground as is shown in the conventional arrangement of FIG. 1. This reconfiguration of circuit elements provides the correction needed to stabilize nodes 123 and 124 against variations in the duty cycle of input signals 117, 118, 119, and 120.

Still referring to FIG. 2, the bias stabilization, with respect to input signal duty cycle variation, is achieved by choosing the divide ratios of resistors 107, 105; and of resistors 108, 106, in a specific way. Consider the following definitions:

R107 is the resistance value of resistor 107
R105 is the resistance value of resistor 105
R108 is the resistance value of resistor 108
R106 is the resistance value of resistor 106
C109 is the capacitance value of capacitor 109
C110 is the capacitance value of capacitor 110
Vdd is the value of the H-bridge power supply
V1 is the logical high value of the voltage signals 117, 118, 119, and 120

Now, C109 and C110 are chosen to be much larger than the $C_{ISS}$ values of PFETs 101 and 102. Thus, essentially 100% of the signal size of signal 117 is coupled to node 123, and essentially 100% of the signal size of signal 118 is coupled to node 124. If we choose divider ratio R105/(R107+R105), and divider ratio R106/(R108+R106), to be equal to V1/Vdd, then the AC (high frequency) solution for nodes 123 and 124 is the same as the DC (low frequency) solution for these nodes. The high frequency path is provided by capacitors 109 and 110. The low frequency path is provided by resistors 107 and 108. The impedance level (scaling) of resistors 105, 106, 107, 108 can be quite high. The time constant of (R105∥R107)*C109 needs to be slow enough so that capacitor 109 does not significantly discharge during the repetitive cycle of the input signal, which is typically several hundred kHz to a few MHz.

Figure 3:
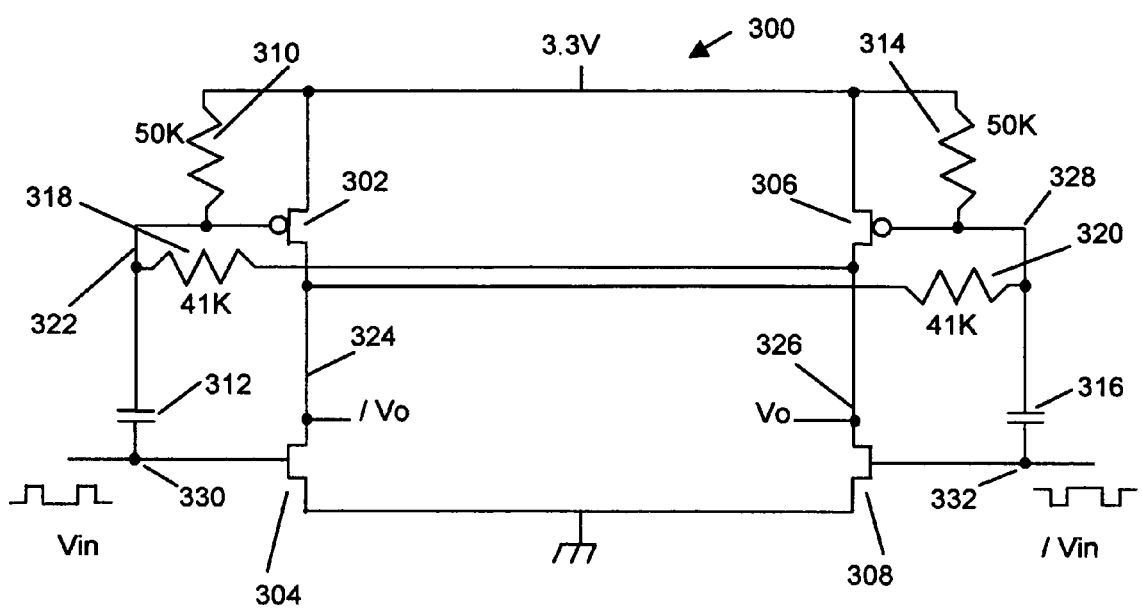
FIG. 3 is a schematic diagram of a capacitively-coupled level-shifter having duty-cycle independence in accordance with the present invention.

Referring to FIG. 3, a level shifter circuit 300 in accordance with the present invention is shown. In the illustrative example shown here, an input having a voltage swing of 1.8 volts is level-shifted so that the voltage swing is 3.3 volts. Vin and /Vin are differential input signals; and Vo and /Vo are differential output signals. Since the transistors of FIG. 3 can be very small, their $C_{ISS}$ will be extremely small. In view of this, the two capacitors shown can be small enough (e.g., hundreds of femto Farad) such that integration on the same integrated circuit with the transistors is practical. It is noted that the resistor values shown (50 KΩ and 41 KΩ) can be swapped in an arrangement to convert, or level-shift, from 3.3 volts to 1.8 volts. Various embodiments of the present invention are suitable for use with at least differential digital signals and provide for any arbitrarily selected magnitude of level-shifting with performance that is substantially independent of the duty cycle of the input signals.

As can be seen in FIG. 3, a CMOS implementation of level shifter 300 includes a first PFET 302 coupled source-to-drain between a first power supply node and node 324. A first NFET 304 is coupled drain-to-source between node 324 and ground. A second PFET 306 is coupled source-to-drain between the first power supply node and node 326. A second NFET 308 is coupled drain-to-source between node 326 and ground. A first resistor 310 is coupled, between the first power supply node and a node 322. A second resistor 318 is coupled between node 322 and node 326. Together, resistors 310 and 318 form a voltage divider, and, in operation act to produce a bias voltage at node 322 (i.e., the gate electrode of PFET 302). A first capacitor 312 is coupled between a node 330 and node 322, thereby providing a means for capacitively coupling an input signal onto the gate electrode of PFET 302. A third resistor 314 is coupled between the first power supply node and a node 328. A fourth resistor 320 is coupled between node 328 and node 324. Together, resistors 314 and 320 form a voltage divider, and, in operation act to produce a bias voltage at node 328 (i.e., the gate electrode of PFET 306). A second capacitor 316 is coupled between a node 332 and node 328, thereby providing a means for capacitively coupling an input signal onto the gate electrode of PFET 306.

When in operation, the first power supply node, shown in the illustrative embodiment of FIG. 3, has a nominal value of 3.3 volts with respect to the ground node. The input signals supplied at nodes 330 and 332 have nominal range of 0 to 1.8 volts with respect to the ground node. It will be appreciated that these voltage values are for illustrative purposes, and that the present invention is not limited to any particular voltages.

Level shifter circuit 300 is suitable for implementation as part of an integrated circuit. It will be appreciated that well-known electrical circuit elements, such as resistors and capacitors, may be constructed in integrated circuits.

By way of illustration and not limitation, the resistors shown in FIG. 3, may be implemented as segments of polycrystalline silicon, with or without ion implantation therein, as well as polycrystalline silicon having a silicide layer formed thereon with any suitable metal, including but not limited to titanium, molybdenum, cobalt, and nickel. Resistors may also be formed from doped regions of the substrate (e.g., junctions in the substrate or in a well, or a well itself, regardless of whether formed by diffusion of implantation). It is noted that while the substrate, or well, is generally formed from single crystal semiconductor material such as silicon, the present invention further contemplates the use of amorphous semiconducting material, such as for example, amorphous silicon, and porous semiconducting materials such as for example porous silicon, in which resistive elements may be formed. FETs may also be used as resistors when those FETs are biased so as permit at least some current flow. It will be appreciated that FETs are generally considered to have a linear and a non-linear region of operation with respect to the current flowing between drain and source as a function of the voltage therebetween. Generally, FETs are not used as resistors because the resistance of such a configuration is not independent of the voltage across the resistor. Serpentine structures formed of interconnect metal are sometimes used as resistive structures, although these tend to be quite large because of the relatively low resistivity of interconnect metals. It is noted that, any suitable structure that may be manufactured within an integrated circuit, and having a resistance within a predetermined range may be used as a resistor for implementation within an integrated circuit. It is further noted, that the present invention contemplates implementations in which one or more of the resistors, capacitors, and transistors is implemented as two or more physically separated elements that are electrically interconnected. For example, a particular resistance value may be obtained by combining two or more parallel and/or serially connected resistive elements. Analogously, particular capacitance values may be obtained by combining two or more parallel and/or serially connected capacitors. Similarly, FETs of a desired channel width can be constructed by combining two or more FETs (typically of the same channel length) in parallel.

It is noted that some or all of the resistors and/or capacitors may be implemented external to the integrated circuit containing the FETs.

With respect to capacitors 312, 316 shown in FIG. 3, it is noted that these capacitors may be implemented as metal-to-metal (i.e., two pieces of metal separated by a dielectric, as gate capacitor (i.e., gate electrode and FET body separated by gate dielectric, polysilicon-to-polysilicon (i.e., formed in a dual layer polysilicon process), or as junction capacitors. The present invention comprehends any suitable structure for forming a capacitor on an integrated circuit, or provided external to such an integrated circuit. It will be appreciated that some of the aforementioned structures (e.g., junction capacitors and In view of the variety of structural alternatives for the implementation of resistors and capacitors, it will be appreciated that the present invention encompasses a wide variety physical layouts.

In the illustrative embodiment of FIG. 3, first resistor 318 has a nominal resistance of 50 KΩ, second resistor 318 has a nominal resistance of 41 KΩ, third resistor 314 has a nominal resistance of 50 KΩ, and fourth resistor 320 has a nominal resistance of 41 KΩ.

Still referring to FIG. 3, it is noted that although the FETs are illustrated as three terminal devices, it is to be understood that the appropriate values of back bias (i.e., well or substrate voltages) are applied during operation of the circuit. The present invention is not limited to the application of any particular back bias, and the present invention contemplates all combinations of well or substrate voltages that are suitable for the physical and electrical characteristics of the transistors and other components used to implement circuitry in accordance with the present invention.

It is noted that, for an integrated circuit implementation of the capacitively coupled H-bridge arrangement which performs the duty cycle independent level shifting of the present invention, a symmetrical layout is typically preferred so as to reduce or eliminate layout-induced performance variations between the two sides of the H-bridge.

It will be appreciated that a method in accordance with the present invention provides a bias network that operates in manner so as to provide a bias signal which will keep the performance of, for example, a level shifter, substantially independent of the duty cycle of an input signal. In an illustrative embodiment, such a method, includes providing a bias network, the bias network having an output node, and operable to provide a bias signal at the bias network output node; providing a first switching element, the first switching element having a control terminal coupled to the bias network output node, the first switching element further having a terminal coupled to a first power supply node, the first power supply node providing a first supply voltage; and capacitively coupling a signal onto the control terminal, the signal having a first voltage swing, and further having a first duty cycle; wherein the output of the bias signal varies such that an output of the first switching element is substantially independent of the first duty cycle. It will be appreciated the aforementioned switching element is typically implemented as a transistor. Field effect transistors generally operate as voltage controlled devices, and so the bias network would provide a voltage signal, whereas bipolar transistors generally operate as current controlled devices, and in this case the bias network would provide a current signal. The bias network may be comprised of resistive elements such as resistors. Those skilled in the art and having the benefit of the present disclosure will appreciate that any such bias network that compensates for the duty cycle of the input signal so as to provide substantial independence of the output of the switching element from the duty cycle is comprehended by the present invention.

CONCLUSION

Described herein are methods and apparatus for achieving level shifting, and particularly level-shifting of digital logic signals, wherein that level shifting is substantially independent of the duty cycle of the input signals.

Various embodiments of the present invention enable clean and effective translation of logic signals from one power supply level to another within a integrated circuit, such as a CMOS integrated circuit.

Various embodiments of the present invention enable high-voltage FETs, which are external to a first integrated circuit and which are fabricated in a low-voltage CMOS process, to be controlled easily and inexpensively.

Various embodiments of the present invention enable the production of Class D amplifier products (switching amplifiers) without the use of a high-voltage semiconductor manufacturing process.

Various embodiments of the present invention allow the high-side of an H-bridge to be driven with less complex and less area-consuming circuitry than conventional approaches, while still providing desired performance characteristics in terms of modulation limits and protection from over-dissipating the H-bridge FETs.

It is to be understood that the present invention is not limited to the embodiments described above, but encompasses any and all embodiments within the scope of the subjoined Claims and their equivalents.

What is claimed is:

1. A circuit, comprising:
   an H-bridge arrangement of field effect transistors, including a pair of high-side transistors connected to a power supply node, the H-bridge having a pair of output nodes, each output node disposed on an opposite side of the H-bridge;
   a first pair of input terminals, each of the first pair of input terminals capacitively coupled to a respective one of the high-side transistors; and
   a pair of voltage dividers, wherein one side of each voltage divider is coupled to the power supply node, and the other side of each voltage divider is cross-coupled to the output node of the opposite side of the H-bridge.

2. The circuit of claim 1, wherein each high-side transistor is a PFET.

3. The circuit of claim 1, wherein the H-bridge includes a pair of low-side transistors, each low-side transistor connected to ground.

4. The circuit of claim 3, wherein each low-side transistor is an NFET.

5. The circuit of claim 1, wherein each voltage divider comprises a pair of resistors.

6. The circuit of claim 1, wherein the H-bridge arrangement, the voltage dividers, and the capacitively coupled input terminals are all integrated within a single integrated circuit.

7. A level-shifter circuit, comprising:
   a first PFET coupled source-to-drain between a first power supply node and a first intermediate node;

a first NFET coupled drain-to-source between the first intermediate node and a second power supply node;

a second PFET coupled source-to-drain between the first power supply node and a second intermediate node;

a second NFET coupled drain-to-source between the second intermediate node and the second power supply node;

a first resistor coupled between the first power supply node and a gate electrode of the first PFET;

a second resistor coupled between the gate electrode of the first PFET and the second intermediate node;

a third resistor coupled between the first power supply node and a gate electrode of the second PFET; and a fourth resistor coupled between the gate electrode of the second PFET and the first intermediate node.

8. The level-shifter of claim 7, further comprising:

a first capacitor having a first terminal coupled to the gate electrode of the first PFET and a second terminal coupled to a gate electrode of the first NFET; and a second capacitor having a first terminal coupled to the gate electrode of the second PFET and a second terminal coupled to a gate electrode of the second NFET.

9. The level-shifter of claim 8, wherein the second terminal of the first capacitor is coupled to a first signal source; and the second terminal of the second capacitor is coupled to a second signal source; and wherein the magnitude of the voltage at the first power supply node is greater than the magnitude of input signals provided by the first signal source and the second signal source.

10. The level-shifter of claim 8, wherein the capacitance of the first capacitor is much greater than the $C_{ISS}$ of the first PFET, and the capacitance of the second capacitor is much greater than the $C_{ISS}$ of the second PFET.

11. The level-shifter of claim 10, wherein the first and second PFETs and the first and second NFETs are integrated on a single integrated circuit, and the first and second capacitors are integrated on the single integrated circuit.

12. The level-shifter of claim 8, wherein a ratio of the resistance of the first resistor divided by the sum of the resistances of the first and second resistors is equal to the high level voltage of an input signal divided by the voltage of the power supply node.

13. The level-shifter of claim 12, wherein a ratio of the resistance of the third resistor divided by the sum of the resistances of the third and fourth resistors is equal to the high level voltage of an input signal divided by the voltage of the power supply node.

14. The level-shifter of claim 8, wherein the PFETs, NFETs, resistors, and capacitors forming a capacitively coupled H-bridge are symmetrically disposed in an integrated circuit layout.

15. A method, comprising:

providing a bias network, the bias network having an output node, and operable to provide a bias signal at the bias network output node;

providing a first switching element, the first switching element having a control terminal coupled to the bias network output node, the first switching element further having a terminal coupled to a first power supply node, the first power supply node providing a first supply voltage;

capacitively coupling a signal onto the control terminal, the signal having a first voltage swing, and further having a first duty cycle;

wherein the output of the bias signal varies such that an output of the first switching element is substantially independent of the first duty cycle.

16. The method of claim 15, wherein the first voltage swing and the first supply voltage are different.

17. The method of claim 15, wherein the first switching element is a transistor.

18. The method of claim 17, wherein the transistor is a bipolar transistor.

19. The method of claim 17, wherein the transistor is a field effect transistor.

20. The method of claim 15, wherein the bias network comprises two or more resistive elements.

* * * * *

UNITED STATES PATENT AND TRADEMARK OFFICE
CERTIFICATE OF CORRECTION

| | | |
|---|---|---|
| PATENT NO. | : 7,282,954 B2 | Page 1 of 1 |
| APPLICATION NO. | : 11/341337 | |
| DATED | : October 16, 2007 | |
| INVENTOR(S) | : Patrick Allen Quinn | |

It is certified that error appears in the above-identified patent and that said Letters Patent is hereby corrected as shown below:

IN THE SPECIFICATION

In column 2, line 12, replace "couple" with -- coupling --;
In column 3, line 26, replace "terminals" with -- terminal --.

Signed and Sealed this
Sixteenth Day of February, 2016

Michelle K. Lee
*Director of the United States Patent and Trademark Office*